United States Patent [19]
Murai

[11] Patent Number: 5,995,732
[45] Date of Patent: Nov. 30, 1999

[54] METHOD AND APPARATUS OF VERIFYING RELIABILITY OF AN INTEGRATED CIRCUIT AGAINST ELECTROMIGRATION

[75] Inventor: Syuzo Murai, Tokyo, Japan

[73] Assignee: NEC Corporation, Tokyo, Japan

[21] Appl. No.: 08/848,014

[22] Filed: Apr. 28, 1997

[30] Foreign Application Priority Data

Apr. 26, 1996 [JP] Japan .................................. 8-131125

[51] Int. Cl.⁶ ...................................................... G06F 17/50
[52] U.S. Cl. .................. 395/500.06; 395/500.05
[58] Field of Search ................................. 364/488, 489, 364/490, 491, 578; 395/500.06, 500.05

[56] References Cited

U.S. PATENT DOCUMENTS

| | | | |
|---|---|---|---|
| 5,349,542 | 9/1994 | Brasen et al. | 364/578 |
| 5,404,310 | 4/1995 | Mitsuhashi | 364/490 |
| 5,410,490 | 4/1995 | Yastrow | 364/488 |
| 5,535,370 | 7/1996 | Raman et al. | 395/500 |
| 5,581,475 | 12/1996 | Majors | 364/491 |
| 5,598,348 | 1/1997 | Rusu et al. | 364/491 |
| 5,737,580 | 4/1998 | Hathaway et al. | 395/500 |
| 5,768,145 | 6/1998 | Roethig | 364/488 |

FOREIGN PATENT DOCUMENTS

| | | |
|---|---|---|
| 4-291755 | 10/1992 | Japan . |
| 5-82647 | 2/1993 | Japan . |

OTHER PUBLICATIONS

Murguisa et al. "Short–Time Failure of Metal Interconnect Caused by Current Pulses" *IEEE Electron Device Letters* 14:481–483 (1993).

*Primary Examiner*—Eric W. Stamber
*Assistant Examiner*—Leigh Marie Garbowski
*Attorney, Agent, or Firm*—Foley & Lardner

[57] ABSTRACT

In order to verify a design of an integrated circuit in terms of a peak current density limit of electromigration specifications, a plurality of transistors, included in a given net of the integrated circuit, are assorted into a plurality of transistor groups. This assortment is based on different logical states which the given net is capable of assuming. Following this, both a lead resistance and load capacitance of the net are determined. Further, a plurality of peak currents respectively associated with the transistor groups are determined using the lead resistance and the load capacitance. Subsequently, a check is made to determine a maximum peak current among the plurality of peak currents already obtained. A peak current density of the maximum peak currents is determined using data of lead shapes, after which a check is further made to determine if the peak current density exceeds the peak current density limit of electromigration specifications.

18 Claims, 5 Drawing Sheets

FIG. 4

$$\begin{pmatrix} \text{TRANSISTOR DATA STORED} \\ \text{IN MEMORY SECTION 20} \end{pmatrix}$$

|     | D1     | D2 | D3 | D4         |
|-----|--------|----|----|------------|
| (a) | M1     | P  | 1  | W1         |
| (b) | M2     | P  | 1  | W2         |
| (c) | M1, M2 | P  | 1  | W1 + W2    |
| (d) | M3, M4 | N  | 2  | W3 (= W4)  |

D1 : TRANSISTOR RENDERED ON AT DIFFERENT LOGIC STATES OF NET A

D2 : TRANSISTOR TYPE

D3 : NUMBER OF CHANNEL CONNECTIONS

D4 : CHANNEL WIDTH

METHOD AND APPARATUS OF VERIFYING RELIABILITY OF AN INTEGRATED CIRCUIT AGAINST ELECTROMIGRATION

BACKGROUND OF THE INVENTION

1. Field of the Invention

The present invention relates generally to improvement in verifying reliability of an integrated circuit against electromigration, and more specifically to a tool of verifying design specifications of a CMOS (complementary metal oxide semiconductor) in connection with a peak current limit of the electromigration specifications.

2. Description of the Related Art

As is well known in the art, metal conductors in an integrated circuit have an upper current density limit imposed by electromigration, the movement of atoms from one place to another under the influence of electrical force. This effect limits the maximum current density of an aluminum (for example) conductor. More specifically, when a high current flows through thin metal conductors in an integrated circuit, metal ions in some regions will pile up and voids will form in other regions. The piled-up metal ions can short-circuit adjacent conductors while the voids can cause an open circuit.

A technique of verifying circuit reliability against electromigration is used to check portions of an integrated circuit, which may be affected by the electromigration, on the basis of data or information of integrated circuit designs.

One example of a conventional technique for investigating the electromigration is disclosed in U.S. Pat. No. 5,410,490 to Yastrow. This conventional technique examines the shapes of metal on a basis of an average of currents flowing through a variety of portions in the circuit. More specifically, data on a capacitance, an average frequency, and a voltage swing of a net are gathered, after which the average current needed to charge and discharge the net is computed. The average current is able to specify a minimum width of metal. Therefore, which do not satisfy the minimum width are checked and the result is displayed on the artwork.

According to the aforesaid conventional technique, the occurrences of electromigration are expected merely relying on the average current density. In other words, no consideration is given to an instantaneously occurring high current density (viz., a large amplitude pulse) by which the electromigration is abruptly induced. As metal conductors become very fine, it is very significant to avoid such an abrupt occurrence of electromigration. A study of a current pulse large enough to cause a metal line to fail instantaneously is disclosed in a paper titled "Short-Time Failure of Metal Interconnection Caused by Current Pulses" by James E. Murguia, et al., IEEE Electron Device Letters, Vol. 14, No 10, October 1993. In order to prevent the instantaneously occurring electromigration due to short-lived, high current pluses, it is necessary to design integrated circuits in consideration of maximum possible currents flowing through the circuits. That is, in the leading semiconductor fabrication field, it is vital to consider the peak current density in addition to the average currents.

SUMMARY OF THE INVENTION

It is therefore an object of the present invention to provide a method of investigating that a layout design of large scaled CMOS circuits can satisfy the peak current density of electromigration specifications.

Another object of the present invention is to provide an apparatus for investigating that a layout design of large scaled CMOS circuits can satisfy the peak current density of electromigration specifications.

In brief, these objects are achieved by techniques wherein, in order to verify a design of an integrated circuit in terms of a peak current density limit of electromigration specifications, a plurality of transistors, included in a given net of the integrated circuit, are assorted into a plurality of transistor groups. This assortment is based on different logical states which the given net is capable of assuming. Following this, both a lead resistance and a load capacitance of the net are determined. Further, a plurality of peak currents respectively associated with the transistor groups are determined using the lead resistance and the load capacitance. Subsequently, a check is made to determine a maximum peak current among the plurality of peak currents already obtained. A peak current density of the maximum peak current is determined using data of lead shapes, after which a check is further made to determine if the peak current density exceeds the peak current density limit of electromigration specifications.

One aspect of the present invention resides in a computer-implemented method of verifying a design of an integrated circuit in terms of a peak current density limit of electromigration specifications, comprising the steps of: (a) assorting a plurality of transistors, included in a given net of said integrated circuit, into a plurality of transistor groups on a basis of different logical states which said given net is capable of assuming; (b) determining a lead resistance of said net; (c) determining a load capacitance of said net (d) determining, using said lead resistance and said load capacitance, a plurality of peak currents respectively associated with said transistor groups; (e) determining a maximum peak current among said plurality of peak currents determined at step (d); (f) determining a peak current density of said maximum peak current using data of lead shapes; and (g) checking to determine if said peak current density exceeds said peak current density limit of electromigration specifications.

Another aspect of the present invention resides in an apparatus for verifying a design of an integrated circuit in terms of a peak current density limit of electromigration specifications, comprising: means for assorting a plurality of transistors, included in a given net of said integrated circuit, into a plurality of transistor groups on a basis of different logical states which said given net is capable of assuming; means for determining a lead resistance of said net; means for determining a load capacitance of said net; peak current detecting means for determining, using said lead resistance and said load capacitance, a plurality of peak currents respectively associated with said transistor groups; means for determining a maximum peak current among said plurality of peak currents determined at said peak current detecting means; means for determining a peak current density of said maximum peak current using data of lead shapes; and means for checking to determine if said peak current density exceeds said peak current density limit of electromigration specifications.

BRIEF DESCRIPTION OF THE DRAWINGS

The features and advantages of the present invention will become more clearly appreciated from the following description taken in conjunction with the accompanying drawings in which like elements are denoted by like reference numerals and in which:

FIG. 4 is an illustration showing data stored in one block of FIG. 1;

DETAILED DESCRIPTION OF THE PREFERRED EMBODIMENTS

Figure 1:
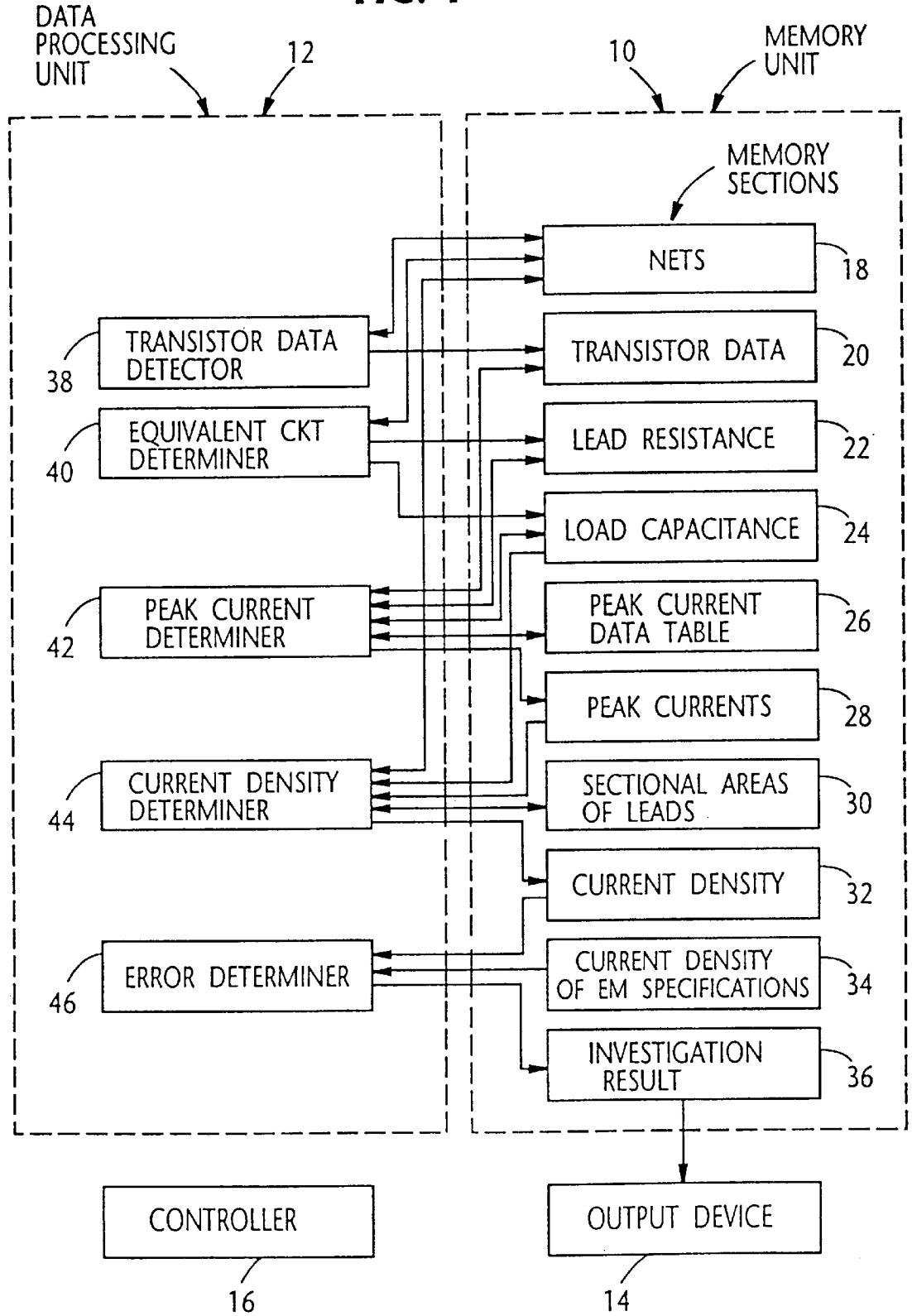
FIG. 1 is a diagram schematically showing a plurality of functional blocks for implementing a preferred embodiment of the present invention.

A preferred embodiment of the present invention will be described with reference to FIGS. 1–5. FIG. 1 is a diagram schematically showing a plurality of functional blocks dedicated to investigating metal interconnect reliability of a given integrated circuit against electromigration in accordance with the present invention. The arrangement of FIG. 1 generally comprises a memory unit 10, a data processing unit 12, an output device unit 14, and a suitable controller (e.g., CPU (central processing unit)) 16 for controlling an overall operation of the units 10, 12, and 14.

As shown in FIG. 1, the net memory section 10 includes a plurality of memory sections. That is, the section 10 comprises, a net memory section 18, a transistor data memory section 20, a lead resistance memory section 22, a load capacitance memory section 24, a peak current data table memory section 26, a peak current memory section 28, a memory section 30 for storing sectional areas of all the leads to be investigated, a current density memory section 32, a memory section 34 for storing a current density limit of electromigration (EM) specifications, and an investigation result memory section 36.

As shown in FIG. 1, the data processing unit 12 comprises, a transistor data detector 38, an equivalent circuit determiner 40, a peak current determiner 42, a current density determiner 44, and an error determiner 46.

Figure 2:
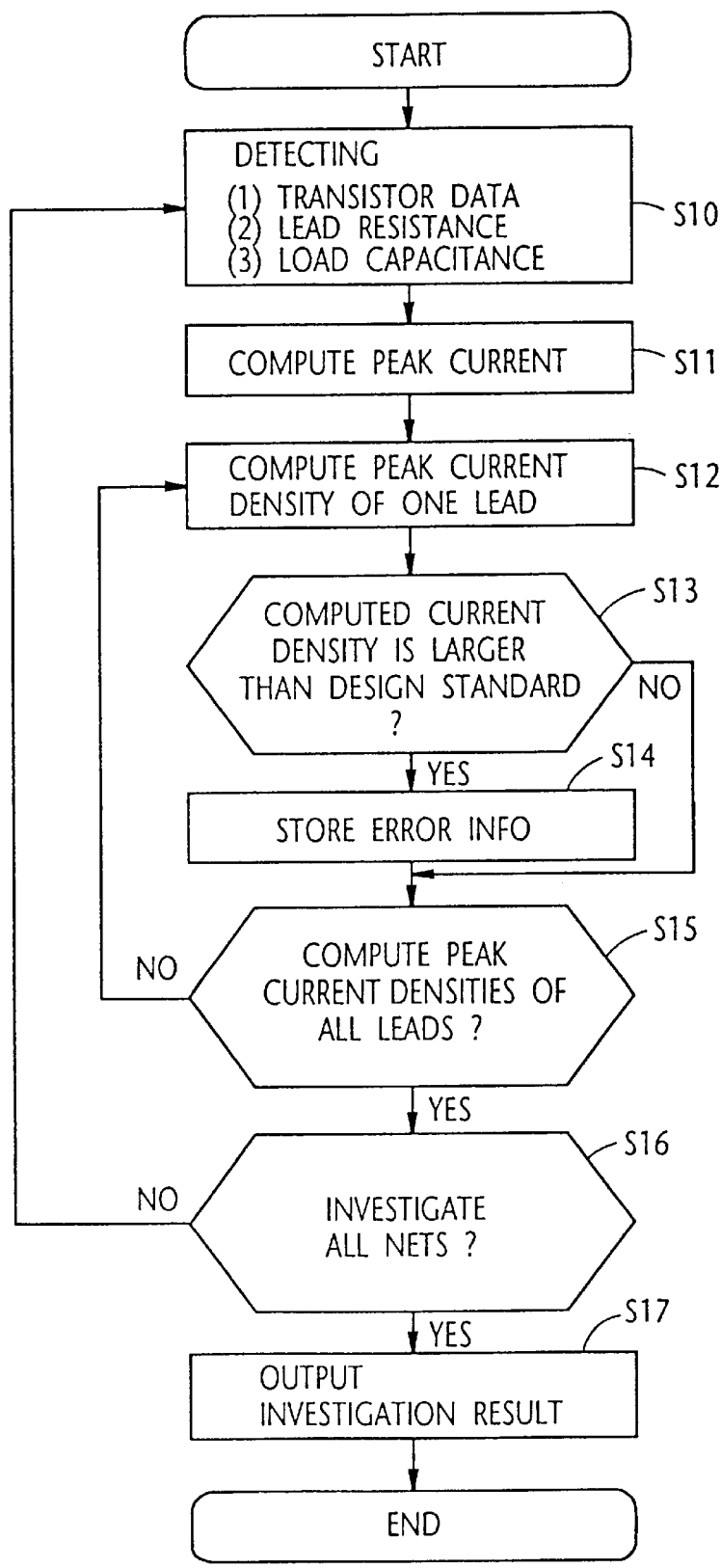
FIG. 2 is a flowchart which shows the steps which characterize the operation of the embodiment as applied to the functional blocks of FIG. 1.

FIG. 2 is a flowchart of an electromigration verification algorithm in accordance with the present invention. The flow chart includes a plurality of processing steps S10–S17.

Figure 3A:
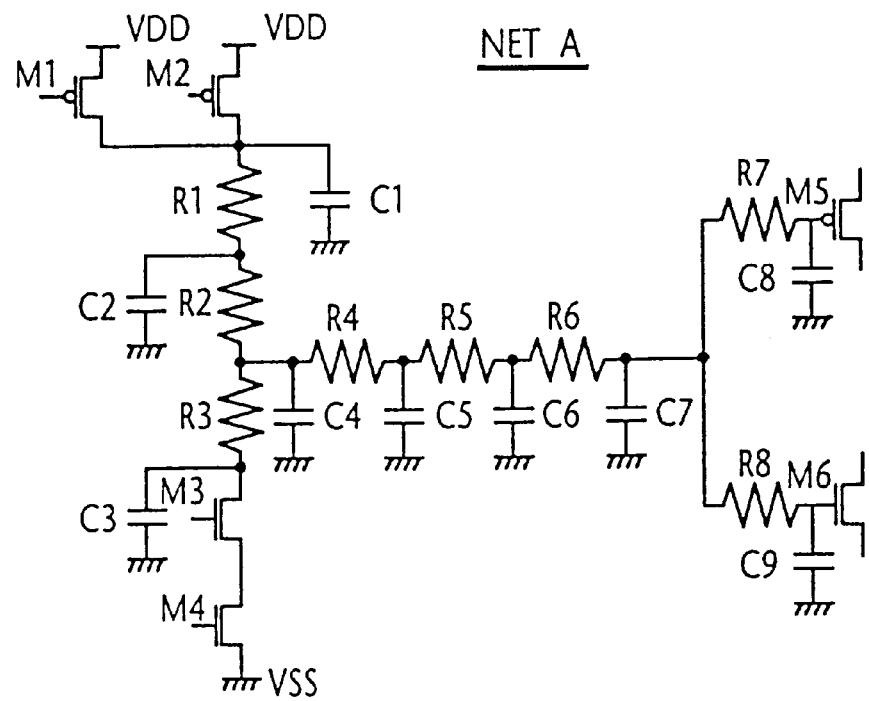
FIG. 3(A) is a circuit diagram of a given net to be investigated in the embodiment of the present invention.

FIG. 3(A) is a circuit diagram (depicted by a net A) which forms part of an integrated circuit previously stored in the net memory on 18. That is to say, the integrated circuit stored in the memory section 18 comprises a plurality of nets which are successively investigated using the processing steps shown in FIG. 2. As is known in the art, the net A can be obtained from a layout design data (mask pattern) using a conventional software such as an LPE (layout parameter extractor). This is applicable to the other nets of the integrated circuit. As shown in FIG. 3(A), the net A comprises MOS transistors M1–M6, resistors R1–R8, and capacitors C1–C9. The resistors R1–R8 are the lumped constants respectively representing leads of the net A, while the capacitors C1–C9 represent parasitic capacitances of the leads of the net A.

Figure 3B:
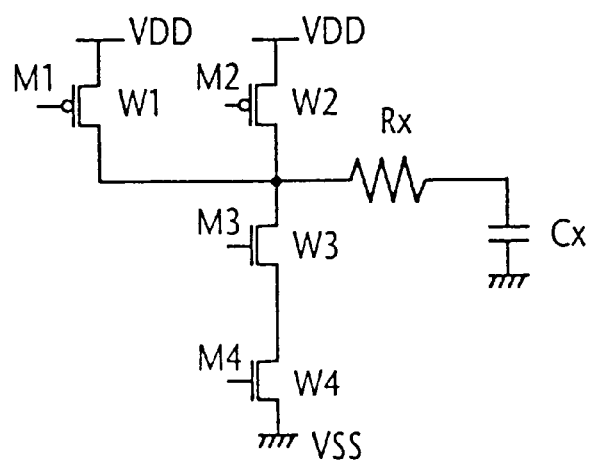
FIG. 3(B) is an approximate equivalent circuit of FIG. 3(A)

FIG. 3(B) shows a circuit which is approximately equivalent to the net A of FIG. 3(A), and will be referred to later. The operations of the present invention will now be described below, in accordance with the steps S10–S17 as shown in FIG. 2.

STEP 10:

At step S10, the transistor data detector 38 retrieves the data of the net A stored in the memory section 18. The detector 38 determines, using the interconnection of transistors included in the net A, a circuit which is provided between a power source VDD and a ground terminal VSS and serves to charge and discharge the net A. Such a circuit, in this particular case, is a NAND circuit which includes the transistors M1, M2, M3, and M4. Following this, a check is made as to which transistor(s), among the transistors M1–M4, is/are rendered ON when the net A changes the logic states thereof when operating as a NAND gate. In this case, there are the following four cases (a)–(d):

(a) only the transistor M1 is rendered ON;

(b) only the transistor M2 is rendered ON;

(c) both the transistors M1 and M2 are rendered ON; and (d) both the transistors M3 and M4 are rendered ON.

In connection with each of the above four cases (a)–(d), the transistor data detector 38 decides the channel type of the transistor(s), the number of channel connections, and a channel width. Thereafter, these data are stored in the transistor data memory section 20 as shown in FIG. 4(A). The case (c) indicates that the transistors M1 and M2 are both rendered ON (the channel widths of the transistors M1 and M2 coupled in parallel are respectively depicted as W1 and W2). In this instance, it can be assumed that a single transistor with the channel width of W1+W2 is rendered ON.

Further, at step S10, the equivalent circuit determiner 40 retrieves the data of the net A and determines, using a conventional technique, an approximate equivalent circuit shown in FIG. 3(B), The equivalent circuit of FIG. 3(B) includes an equivalent lead resistance (Rx) and capacitance (Cx). The determiner 40 stores the values of Rx and Cx in the memory sections 22 and 24, respectively.

STEP S11;

At step S11, the peak current determiner 42 accesses the memory section 20 and retrieves the data listed in FIG. 4. Further, the determiner 42 retrieves the lead resistance "Rx" from the memory section 22, and also retrieves the load capacitance "Cx" from the memory section 24. Still further, the peak current determiner 42 refers to the peak current data table which has already been stored in the memory section 26. Subsequently, the determiner 44 specifies four peak currents respectively related to the cases (a)–(d) stored in the memory section 20 using the data obtained from the memory sections 20, 22, and 24.

Figure 5A:
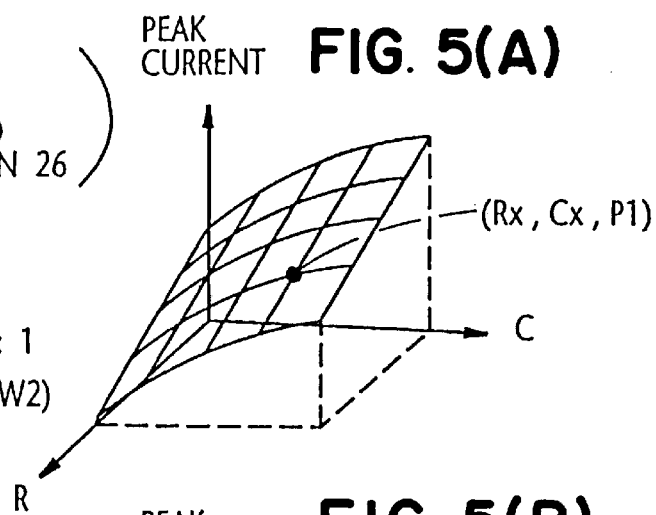
FIG. 5(A) is a diagram graphically showing a data table used in the embodiment of the present invention.
Figure 5B:
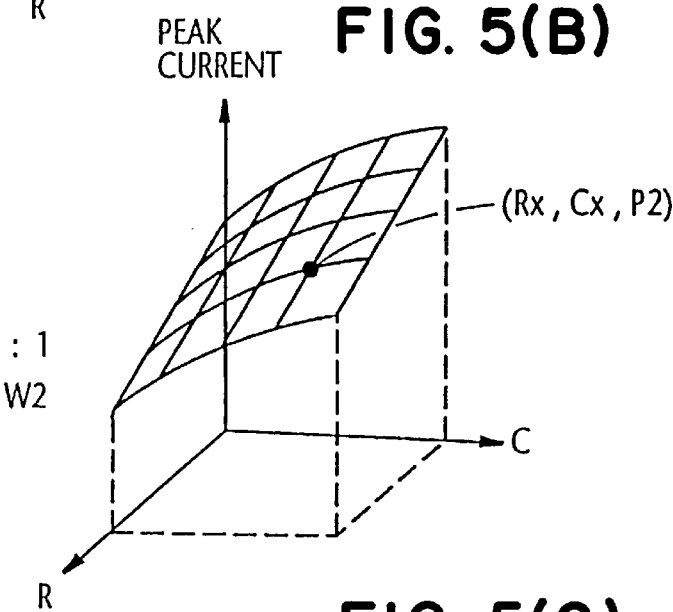
FIG. 5(B) is a diagram graphically showing a data table used in the embodiment of the present invention.
Figure 5C:
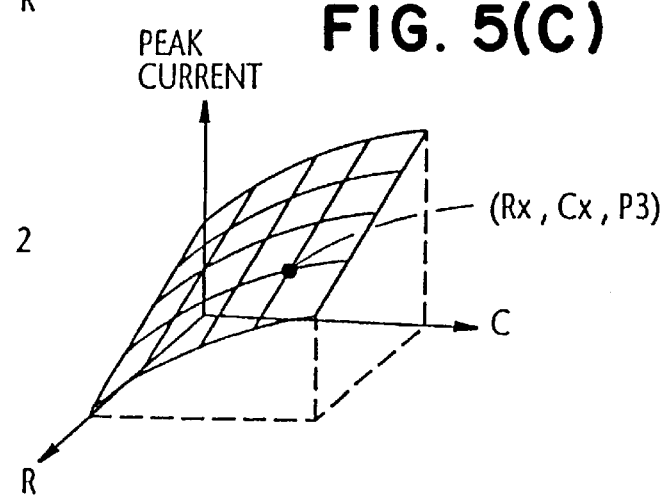
FIG. 5(C) is a diagram graphically showing a data table used in the embodiment of the present invention.

The peak current data table previously stored in the memory section 26 includes first to third sub-tables which are graphically illustrated in FIGS. 5(A), 5(B) and 5(C), respectively. This kind of peek current data table can be obtained using an appropriate circuit simulation program such as SPICE (simulation program with integrated circuit emphasis).

The first sub-table 5(A) includes data related to each of the cases (a) and (b) of FIG. 4 wherein the transistor is PMOS, the number of channel connections is one, and the channel width is W1(=W2). As shown in FIGS. 5(A)–5(C), a plurality of peak currents are respectively specified by a plurality of pairs of Ri and Ci (i=0, . . . , n) where Ri represents an i-th lead resistance of the net A while Ci represents an i-th load capacitance of the net A.

Likewise, the second sub-table 5(B) includes data related to the case (c) of FIG. 4 wherein the transistor is PMOS, the number of channel connections is one, and the channel width is W1+W2. As in the above, a plurality of peak currents are respectively specified by a plurality of pairs of Ri and Ci (i=0, ..., n) where Ri represents an i-th lead resistance of the net A while Ci represents an i-th load capacitance of the net A.

The third sub-table 5(C) includes data read to the case (d) of FIG. 4 wherein the transistor is NMOS, the number of channel connections is two, and the channel width is W3. As in the above, a plurality of peak currents are respectively specified by a plurality of pairs of Ri and Ci (i=0, ..., n) where Ri represents an i-th lead resistance of the net A while Ci represents an i-th load capacitance of the net A.

It is understood from the foregoing that the peak current determiner 42 is able to specify the four peak currents P1, P1, P2, and P3, using Rx and Cx, in connection with the cases (a), (b), (c), and (d) shown in FIG. 4. These peak currents P1, P1, P2, and P3 are stored in the peak current memory section 28.

STEP S12:

At step 12, the current density determiner 44 specifies a current density at each of the leads respectively represented by the resistors R1–R8 of the net A. In the following, only a current density at the resistor R5 will be given for the sake of simplifying the disclosure.

It is assumed that the lead's sectional area memory section 30 has already stored a sectional area of each of the resistors R1–R8 using a technique known in the art.

Before determining the current density at the resistor R5, the current density determiner 44 retrieves the peak currents P1, P2, and P3 from the memory section 28 and decides the largest one (depicted by Pmax) among them. Subsequently, the determiner 44 retrieves the data of the net A from the net memory section 18 and determines a capacitance (depicted by Cy) toward the transistors M5 and M6 from the resistor R5. That is to say, the capacitance Cy is given by $$Cy = C5 + C6 + C7 + C8 + C9 + CM5 + CM6 \quad (1)$$

where CM5 and CM6 respectively represent gate capacitances of the transistor M5 and M6.

Following this, the determiner 44 retrieves the sectional area (depicted by Sa5) of the lead represented by the resistor R5 from the memory section 30 and further retrieves the capacitance Cx stored in the memory section 24. Thus, the determiner 44 specifies the current density (depicted by Jr5) at the lead represented by the resistor R5 as follows.

$$Jr5 = Pmax \cdot (Cy/Cx) \cdot (1/(Sa5)) \quad (2)$$

The current density Jr5 thus obtained is stored in the current density memory section 32 with a label indicative of the resistor R5.

STEPS S13 and S14:

At these steps, the error determiner 46 retrieves the current density Jr5 stored in the memory section 32 and also retrieves a current density of the electromigration specifications (depicted by J-limit). If Jr5 exceeds J-limit, a suitable error indication is stored in the investigation result memory section 36. In this case, it is preferable to represent a ratio of Jr5 to J-limit in that an investigator is easily informed of the degree of the excessive current density of Jr5. On the other hand, if Jr5 does not reach J-limit, then the routine proceeds to step S15.

STEPS S15, S16 and S17:

At these steps, a check is made to determine if the current densities of all the leads (viz., R1–R8) have been decided. If the answer is negative, the routine returns to step 12 and repeats the above mentioned processed in connection with the next lead. On the contrary, if an inquiry made at step 15 is affirmative, the routine proceeds to step S16 at which a check is further made to determine if all the nets stored in the memory section 18 have been investigated. If not yet, the next net will be subjected to the aforesaid steps S10–S15. At the final stage of the routine (viz., at step 17), the investigation results are applied to the output device 14.

It will be understood that the above disclosure is representative of only one possible embodiment of the present invention and that the concept on which the invention is based is not specifically limited thereto.

What is claimed is:

1. A computer-implemented method of verifying a design of an integrated circuit in terms of a peak current density limit of electromigration specifications, comprising the steps of:
    (a) sorting a plurality of transistors, included in a given net of said integrated circuit, into a plurality of transistor groups on a basis of different logical states which said given net is capable of assuming;
    (b) determining a lead resistance of said net;
    (c) determining a load capacitance of said net;
    (d) determining, using said lead resistance and said load capacitance, a plurality of peak currents respectively associated with said transistor groups;
    (e) determining a maximum peak current from among said plurality of peak currents determined at step (d);
    (f) determining a peak current density, corresponding to a specific location of said net to be examined, by utilizing said maximum peak current, and a lead sectional area, wherein said lead sectional area is based upon at least one of a plurality of data characterizing lead shapes; and
    (g) checking to determine if said peak current density exceeds said peak current density limit of electromigration specifications.

2. A method as claimed in claim 1, wherein step (d) further comprises the step of referring to a table which has been prepared, said table comprised of a plurality of peak currents each defined by a set of a lead resistance and a load capacitance.

3. A method as claimed in claim 1, further comprising the step of storing a check result, obtained at step (g), in a memory.

4. A computer implemented method as recited in claim 1, wherein
    step (c) further comprises storing said load capacitance of said net in a load capacitance memory section, and wherein
    step (f) further comprises
        (f.1) retrieving at least one of a plurality of data characterizing said net from a net memory section, said data previously stored in said net memory section,
        (f.2) determining a specific capacitance, corresponding to a specific location of said net to be verified, utilizing said data of said net,
        (f.3) retrieving a lead sectional area, from a plurality of lead sectional areas, said lead sectional areas previously stored in a sectional area memory section,
        (f.4) retrieving said load capacitance of said net from said load capacitance memory section
        (f.5) determining a peak current density, corresponding to a specific location of said net to be examined, by utilizing said maximum peak current, said specific capacitance, said lead sectional area, and said load capacitance, and (f.6) storing said peak current density in a peak current density memory section.

5. A computer implemented method as recited in claim 1, wherein step (f) further comprises (f.1) retrieving at least one of a plurality of data characterizing said net from a net memory section, said data previously stored in said net memory section, (f.2) determining a specific capacitance, corresponding to a specific location of said net to be verified, utilizing said data of said net, (f.3) retrieving a lead sectional area, from a plurality of lead sectional areas, said lead sectional areas previously stored in a sectional area memory section, and (f.4) determining a peak current density, corresponding to a specific location of said net to be examined, by utilizing said maximum peak current, said specific capacitance, said lead sectional area, and said load capacitance.

6. A computer implemented method as recited in claim 1, further comprising the step of (h) calculating a ratio utilizing said peak current density and said peak current density limit of electromigration specifications.

7. A computer implemented method as recited in claim 1, wherein step (f) further comprises determining said peak current density, corresponding to a specific location of said net to be examined, by utilizing said maximum peak current, a specific capacitance, said lead sectional area, and said load capacitance.

8. A computer implemented method as recited in claim 1, wherein said lead resistance of said net is determined by utilizing an approximately representational circuit.

9. A computer implemented method as recited in claim 1, wherein said load capacitance of said net is determined by utilizing an approximately representational circuit.

10. An apparatus for verifying a design of an integrated circuit in terms of a peak current density limit of electromigration specifications, comprising:

(a) means for sorting a plurality of transistors, included in a given net of said integrated circuit, into a plurality of transistor groups on a basis of different logical states which said given net is capable of assuming:

(b) means for determining a lead resistance of said net;

(c) means for determining a load capacitance of said net;

(d) peak current detecting means for determining, using said lead resistance and said load capacitance, a plurality of peak currents respectively associated with said transistor groups;

(e) means for a determining a maximum peak current from among said plurality of peak currents determined at said peak current detecting means;

(f) means for determining a peak current density, corresponding to a specific location of said net to be examined, by utilizing said maximum peak current, and a lead sectional area, wherein said lead sectional area is based upon at least one of a plurality of data characterizing lead shapes; and (g) means for checking to determine if said peak current density exceeds said peak current density limit of electromigration specifications.

11. An apparatus as claimed in claim 10, wherein said peak current detecting means refers to a table which has been prepared and includes a plurality of peak currents each defined by a set of a lead resistance and a load capacitance.

12. An apparatus as claimed in claim 10, further comprising means for storing a check result, said check result obtained by said means for checking.

13. An apparatus as recited in claim 10, wherein said means for determining a maximum peak current density of said maximum peak current further comprises (f.1) a means for retrieving at least one of a plurality of data characterizing said net, said data previously stored in a means for storing at least one data of said net, (f.2) a means for determining a specific capacitance, corresponding to a specific location of said net to be verified, utilizing said data of said net, (f.3) a means for retrieving a lead sectional area, from a plurality of lead sectional areas, said lead sectional areas previously stored in a means for storing a lead sectional area, and (f.4) a means for determining a peak current density, corresponding to a specific location of said net to be examined, by utilizing said maximum peak current, said specific capacitance, said lead sectional area, and said load capacitance.

14. An apparatus as recited in claim 10, wherein said means for determining a load capacitance further comprises a means for storing a load capacitance of said net, and wherein said means for determining a maximum peak current density of said maximum peak current further comprises (f.1) a means for retrieving at least one of a plurality of data characterizing said net, said data previously stored in a means for storing at least one data of said net, (f.2) a means for determining a specific capacitance, corresponding to a specific location of said net to be verified, utilizing said data of said net, (f.3) a means for retrieving a lead sectional area, from a plurality of lead sectional areas, said lead sectional areas previously stored in a means for storing a lead sectional area, and (f.4) a means for retrieving a load capacitance of said net from said means for storing a load capacitance, (f.5) a means for determining a peak current density, corresponding to a specific location of said net to be examined, by utilizing said maximum peak current, said specific capacitance, said lead sectional area, and said load capacitance, and (f.6) a means for storing a peak current density.

15. An apparatus as recited in claim 10, wherein said means for determining a peak current density further comprises a means for determining said peak current density, corresponding to a specific location of said net to be examined, by utilizing said maximum peak current, a specific capacitance, said lead sectional area, and said load capacitance.

16. An apparatus as recited in claim 10, wherein said means for determining a lead resistance of said net utilizes an approximately representational circuit.

17. An apparatus as recited in claim 10, wherein said means for determining a load capacitance of said net utilizes an approximately representational circuit.

18. An apparatus as recited in claim 10, further comprising (h) means for calculating a ratio utilizing said peak current density and said peak current density limit of electromigration specifications.

* * * * *